United States Patent
Zhang et al.

(10) Patent No.: US 12,314,840 B2
(45) Date of Patent: May 27, 2025

(54) FAULT DIAGNOSIS METHOD AND APPARATUS FOR FOUR-SWITCH BUCK-BOOST CONVERTER

(71) Applicant: ZHEJIANG UNIVERSITY, Hangzhou (CN)

(72) Inventors: Xin Zhang, Hangzhou (CN); Xueqi Liu, Hangzhou (CN); Hao Ma, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/640,874

(22) Filed: Apr. 19, 2024

(65) Prior Publication Data

US 2024/0386248 A1    Nov. 21, 2024

(30) Foreign Application Priority Data

May 9, 2023 (CN) .......................... 202310532465.0

(51) Int. Cl.
   *G06N 3/0464* (2023.01)
   *G01R 31/40* (2020.01)
   *G01R 31/54* (2020.01)

(52) U.S. Cl.
   CPC .......... *G06N 3/0464* (2023.01); *G01R 31/40* (2013.01); *G01R 31/54* (2020.01)

(58) Field of Classification Search
   CPC ...... G06N 3/0464; G01R 31/40; G01R 31/54; H02J 50/10; H02J 50/12; H02J 50/80
   See application file for complete search history.

(56) References Cited

FOREIGN PATENT DOCUMENTS

| CN | 111899905 | 11/2020 | |
|---|---|---|---|
| CN | 113759289 A | * 12/2021 | ......... G01R 31/2621 |

(Continued)

OTHER PUBLICATIONS

C. Sun et al. "Fault Diagnosis Methods Based on Machine Learning and Its Applications for Wind Turbines: A Review", IEEE Access, Open Access Journal, Oct. 28, 2021. (Year: 2021).*

(Continued)

*Primary Examiner* — Eman A Alkafawi
*Assistant Examiner* — Dilara Sultana
(74) *Attorney, Agent, or Firm* — Jiwen Chen; Joywin IP Law PLLC (57) ABSTRACT

Disclosed is a fault diagnosis method for a four-switch Buck-Boost converter, including the following steps: obtaining circuit parameters when different faults occur, labeling fault parameters with fault types, and combining the fault parameters and labels into a data set; constructing a simplified self-organizing neural network consisting of a plurality of nonlinear operation modules, a weighting module, and an analysis module; performing training by using the data set to obtain a self-organizing neural network for determining the faults of the converter; and inputting the circuit parameters of the four-switch Buck-Boost converter to the self-organizing neural network, so as to determine the fault types of the four-switch Buck-Boost converter. Further disclosed is a fault diagnosis apparatus for a four-switch Buck-Boost converter. The method provided by the present invention is capable of simultaneously identifying and locating the faults of the four-switch Buck-Boost converter, such as an open circuit fault of a switching tube, aging of a capacitor, and aging of an inductor, and has good diagnosis accuracy and generalization capability.

6 Claims, 2 Drawing Sheets

(56) References Cited

FOREIGN PATENT DOCUMENTS

| CN | 115081316 | | | 9/2022 | |
|---|---|---|---|---|---|
| CN | 115600422 | | | 1/2023 | |
| CN | 115656731 | A | * | 1/2023 | |
| CN | 112199890 | B | * | 3/2023 | ............. G06F 30/27 |

OTHER PUBLICATIONS

Satyawan et al. "Switch Open-circuit Fault Diagnosis and Fault-Tolerant Control Strategy for DC-DC Converters", International Conference on Communication and Signal Processing, Jul. 28-30, 2020, India. (Year: 2020).*

Jiang et al. "Fault Diagnosis of Buck Converter under Variable Operating Conditions Based on Optimal Fractional Wavelet Transform", 2020 11th International Conference on Prognostics and System Health Management (PHM-2020 Jinan (Year: 2020).*

* cited by examiner

FAULT DIAGNOSIS METHOD AND APPARATUS FOR FOUR-SWITCH BUCK-BOOST CONVERTER

This application claims priority of Chinese Application No. 2023105324650, May 9, 2023, which is hereby incorporated by reference.

TECHNICAL FIELD

The present invention relates to the field of circuit fault detection, in particular to a fault diagnosis method and apparatus for a four-switch Buck-Boost converter.

BACKGROUND TECHNOLOGY

Distributed power generation systems and new energy vehicles will become the key development direction in the future. From the supply side, as of May 2022, the total installed capacity of renewable energy power generation in China has reached 1.1 billion kilowatts. On the demand side, China has become the world's largest producer of new energy vehicles, accounting for 38.9% of the world's total production. New energy power generation systems and new energy vehicle industry chains, mainly based on wind farms and photovoltaic solar energy, are facing great opportunities for development, and four-switch Buck-Boost converters play an important role in the fields of new energy power generation and new energy vehicles.

In practical operation, when the converter fails, power outage, system shutdown, and traffic paralysis may be caused, and huge economic losses are brought about, so the converter needs to be improved in reliability and have certain fault diagnosis and fault redundancy capabilities. Faults of the converter include structural faults and parametric faults, where the structural faults include an open circuit fault of a switching tube, an open circuit fault of an inductor, an open circuit fault of a capacitor, and the like, the parametric faults include aging of the inductor, aging of the capacitor, and the like, and the parametric faults not repaired in time will evolve into the structural faults. At present, a fault diagnosis method using an intelligent algorithm has been widely studied due to its characteristics of no need to build a complex circuit model, wide applicability, and the like. A deep learning algorithm such as a convolutional neural network (CNN) or a recurrent neural network (RNN) has a good feature extraction capability, but with an increase in the number of network layers, the computational complexity also greatly increases.

In the patent document CN115081316A, an improved sparrow search algorithm based fault diagnosis method and system for a direct current/direct current (DC/DC) converter are disclosed. The method includes: building a simulation model for the DC/DC converter, selecting a leakage inductance current of a transformer as a diagnosis signal, and acquiring diagnosis signal samples of different power switch devices of the DC/DC converter under open circuit faults as a sample set; improving the global search capability of a sparrow search algorithm by using a Levy flight strategy; dividing the sample set into a training set and a test set, preliminarily establishing an architecture of a deep belief network, and initializing network parameters; optimizing the number of hidden layer units of the deep belief network by using the improved sparrow search algorithm to obtain the optimal number of hidden layer units of the deep belief network; and training the deep belief network optimized by the improved sparrow search algorithm, and obtaining a fault diagnosis result based on the trained network.

In the patent document CN115600422A, a fault diagnosis method for a power converter in case of multi-noise mixing and multi-operating modes is disclosed, including: building a state space model for the power converter; designing a state estimator for the power converter by a minimum mean square error and a multicellular space; when an operating mode of the power converter changes, first, determining whether the operating mode of the power converter changes; if it is detected that a measured output is not within an estimated output range, further distinguishing a condition that a fault occurs to a system from a condition that an operating mode of the system changes by determining whether the measured output is within output ranges of all operating modes of the power converter; and if the fault occurs to the system, a fault estimator for the power converter is constructed to estimate the fault of the system.

SUMMARY OF INVENTION

The present invention aims to provide a fault diagnosis method for a four-switch Buck-Boost converter. The method is capable of effectively determining fault types of the four-switch Buck-Boost converter.

A fault diagnosis method for a four-switch Buck-Boost converter includes the following steps:

obtaining circuit parameters when different faults occur, labeling fault parameters with fault types, and combining the fault parameters and labels into a data set;

constructing a simplified self-organizing neural network consisting of a plurality of nonlinear operation modules, a weighting module, and an analysis module, performing, by the plurality of nonlinear operation modules, eigenvalue calculation based on the inputted circuit parameters, performing, by the weighting module, weighting calculation based on all eigenvalues to obtain weighted eigenvalues, and predicting, by the analysis module, the fault types based on the weighted eigenvalues;

performing training by using the data set to obtain a self-organizing neural network for determining the faults of a converter; and inputting the circuit parameters of the four-switch Buck-Boost converter to the self-organizing neural network, so as to determine the fault types of the four-switch Buck-Boost converter.

According to the present invention, improvement is made on the basis of a convolutional neural network, a heterogeneous structure is adopted, and weight operation is performed on different neurons by using nonlinear operators, such that the better learning capability is achieved compared with the convolutional neural network with the same depth, and different fault types can be diagnosed.

Specifically, the faults include:

an open circuit fault of a switching tube S1, an open circuit fault of a switching tube S2, and an open circuit fault of a switching tube S3 of the four-switch Buck-Boost converter in a Buck mode;

an open circuit fault of a switching tube S1, an open circuit fault of a switching tube S3, and an open circuit fault of a switching tube S4 in a Boost mode;

an open circuit fault of a switching tube S1, an open circuit fault of a switching tube S2, an open circuit fault of a switching tube S3, and an open circuit fault of a switching tube S4 in a Buck-Boost mode;

an inductance drift exceeding 10%; and capacitance drift exceeding 10%.

Specifically, the circuit parameters include a bridge arm midpoint voltage, an inductive current, and an output voltage.

Specifically, the circuit parameters need to undergo pre-processing, including normalization processing of the circuit parameters, before being inputted to the self-organizing neural network.

$$V'_{ab}[k] = \frac{V_{ab}[k]}{V_{ab,n}[k]}$$

$$i'_L[k] = \frac{i_L[k]}{i_{L,n}[k]}$$

$$V'_o[k] = \frac{V_o[k]}{V_{o,n}[k]}$$

where $V_{ab}[k]$ is a bridge arm midpoint voltage sampled at a $k^{th}$ time point, $V_{ab,n}[k]$ is a normal bridge arm midpoint voltage at the $k^{th}$ time point, $i_L[k]$ is an inductive current sampled at the $k^{th}$ time point, $i_{L,n}[k]$ is a normal inductive current at the $k^{th}$ time point, $V_o[k]$ is an output voltage sampled at the $k^{th}$ time point, and $V_{o,n}[k]$ is a normal output voltage at the $k^{th}$ time point.

Specifically, a weight of each nonlinear operator in the plurality of nonlinear operation modules is calculated by using a particle swarm optimization algorithm, and a specific process is as follows:

parameters of the particle swarm optimization algorithm are set, where the number of particles is N, and a particle dimension D=the number n of network layers× the number m of nonlinear operators;

an inertia weight linear decreasing strategy is adopted for an inertia weight, and an error between a predicted result and an actual result is used as a fitness function in the particle swarm optimization algorithm to determine an individual historical optimal position of each particle and a historical optimal position in a whole particle swarm, where an expression for the inertia weight linear decreasing strategy is as follows:

$$\omega = \omega_{max} - \frac{iter*(\omega_{max}-\omega_{min})}{iter_{max}}$$

where $\omega$ is an inertia weight factor, and iter is the number of iterations;

based on updated velocities and positions of the particles, fitness values of the particles are recalculated and an individual historical optimal position of each particle and a historical optimal position in the whole particle swarm are determined, where an expression for the updated velocities and positions of the particles is as follows:

$$v_{i\_d}^{k+1} = \omega v_{i\_d}^k + c_1 r_1(a_{i\_d}^k - x_{i\_d}^k) + c_2 r_2(B_d^k - x_{i\_d}^k)$$

where $1 \leq i \leq N$, $1 \leq d \leq D$; k represents the number of current iterations; $c_1$ and $c_2$ are learning factors; and $r_1$ and $r_2$ are random numbers in [0, 1].

it is determined whether new fitness meets a requirement, and if the new fitness meets the requirement, an optimal position is outputted as an optimal weight value, otherwise, repeated iteration is performed until an end condition is met.

Specifically, the training of the simplified self-organizing neural network includes a feedforward process and a feedback propagation process; an expression for the feedforward process is as follows:

$$x_k^l(m) = b_k^l + \sum_{i=1}^{C} P_k^l\left(\Psi_k^l\left(w_{ik}^l(r)\left(y_i^{l-1}(m+r)\right)\right)\right)$$

$$= b_k^l + \sum_{i=1}^{C}\sum_{r=0}^{K-1} \Psi_k^l\left(w_{ik}^l(r)\left(y_i^{l-1}(m+r)\right)\right)$$

where $w_{ik}^l(r)$ is a weight at a position r of a $k^{th}$ convolution kernel corresponding to a channel i of an $(l-1)^{th}$ layer, and a size of each convolution kernel is 1×K; C is the number of channels of the $(l-1)^{th}$ layer; and $b_k^l$ is a bias corresponding to a $k^{th}$ channel of an $l^{th}$ layer, $\Psi_k^l$ is a node operator, and $P_k^l$ is a pooling operator; and the feedback propagation process includes setting of a Softmax layer for determining a probability of outputting each type, where an expression for the feedback propagation process is as follows:

$$F_t = e^{o_t} / \sum_{r=1}^{g} e^{o_r}$$

where $F_t$ represents a possibility that an output feature of the neural network belongs to a type t, an output of the Softmax layer is a (g=12)-dimensional vector, a value of each element ($F_1, F_2, \ldots, F_{12}$) is normalized to within a range of 0 to 1 and a sum of all elements is 1, and $O_t$ represents output information of a $t^{th}$ output neuron.

Specifically, during the training, a cross entropy loss function and a gradient descent method are used to update parameters of the simplified self-organizing neural network.

Specifically, an expression for the cross entropy loss function is as follows:

$$L_t = -\sum_{t=1}^{g} F_t^* \ln F_t$$

where $F_t^*$ and $F_t^*$ are a target value and an actual value of an output element, respectively.

Specifically, an expression for the gradient descent method is as follows:

$$w_{ik}^l(t+1) = w_{ik}^l(t) - \frac{dL}{dx_i^l}\nabla_w \Psi_{ki}^{l+1}$$

$$b_k^l(t+1) = b_k^l(t) - f'(x_k^l)\sum_{i=1}^{N_{t+1}} \frac{dL}{dx_i^l}\nabla_w \Psi_{ki}^{l+1}$$

The present invention further provides a fault diagnosis apparatus for a four-switch Buck-Boost converter, including a computer memory, a computer processor, and a computer program stored in the computer memory and executable on the computer processor, where the self-organizing neural network above is adopted in the computer memory.

Circuit parameters of a four-switch Buck-Boost converter are inputted to the self-organizing neural network, so as to determine fault types of the four-switch Buck-Boost converter.

Compared with the prior art, the present invention has the following beneficial effects:

Improvement is made on the basis of a convolutional neural network, a heterogeneous structure is adopted, and weight operation is performed on different neurons by using nonlinear operators, such that the better learning capability is achieved compared with the convolutional neural network with the same depth, and different fault types can be diagnosed.

DETAILED DESCRIPTION OF THE EMBODIMENTS

Exemplary embodiments of the present invention are now described with reference to the accompanying drawings. However, the present invention may be implemented in many different forms and is not limited to the embodiments described herein. These embodiments are provided in order to disclose the present invention in detail and completely, and to fully convey the scope of the present invention to those skilled in the art. The terms in the exemplary embodiments shown in the drawings are not intended to limit the present invention. In the drawings, the same reference signs are used for the same units/elements.

The terms (including scientific and technical terms) used herein have meanings commonly understood by those skilled in the art, unless otherwise stated. In addition, it can be understood that the terms defined by commonly used dictionaries should be understood as having meanings consistent with the contexts of related fields and should not be construed in an idealized or overly formal sense.

Figure 1:
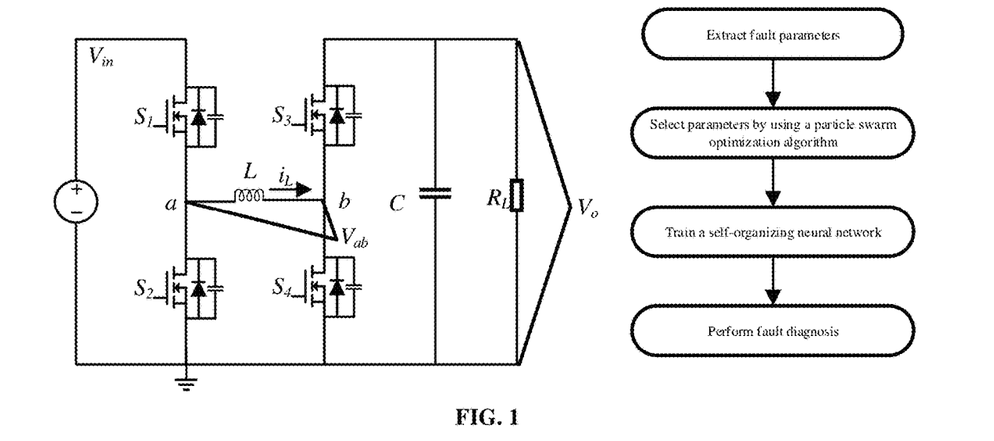
FIG. 1 is a schematic diagram of a fault diagnosis method for a four-switch Buck-Boost converter provided by this embodiment.

As shown in FIG. 1, a topological structure of a four-switch Buck-Boost converter includes a voltage drop unit consisting of S1 and S2, and a voltage rise unit consisting of S3 and S4.

A simplified self-organizing neural network based fault diagnosis method for a four-switch Buck-Boost converter includes the following steps.

A bridge arm midpoint voltage $V_{ab}$, an inductive current $i_L$, and an output voltage $V_o$ are obtained, and normalization processing is performed according to the following formulas:

$$V'_{ab}[k] = \frac{V_{ab}[k]}{V_{ab,n}[k]}$$

-continued $$i'_L[k] = \frac{i_L[k]}{i_{L,n}[k]}$$

$$V'_o[k] = \frac{V_o[k]}{V_{o,n}[k]}$$

where $V_{ab}[k]$ is a bridge arm midpoint voltage sampled at a $k^{th}$ time point, $V_{ab,n}[k]$ is a normal bridge arm midpoint voltage at the $k^{th}$ time point, $i_L[k]$ is an inductive current sampled at the $k^{th}$ time point, $i_{L,n}[k]$ is a normal inductive current at the $k^{th}$ time point, Vo[k] is an output voltage sampled at the $k^{th}$ time point, and $V_{o,n}[k]$ is a normal output voltage at the $k^{th}$ time point.

The normalized circuit parameters are inputted to a neural network, such that an input feature graph of the neural network contains three channels.

Figure 3:
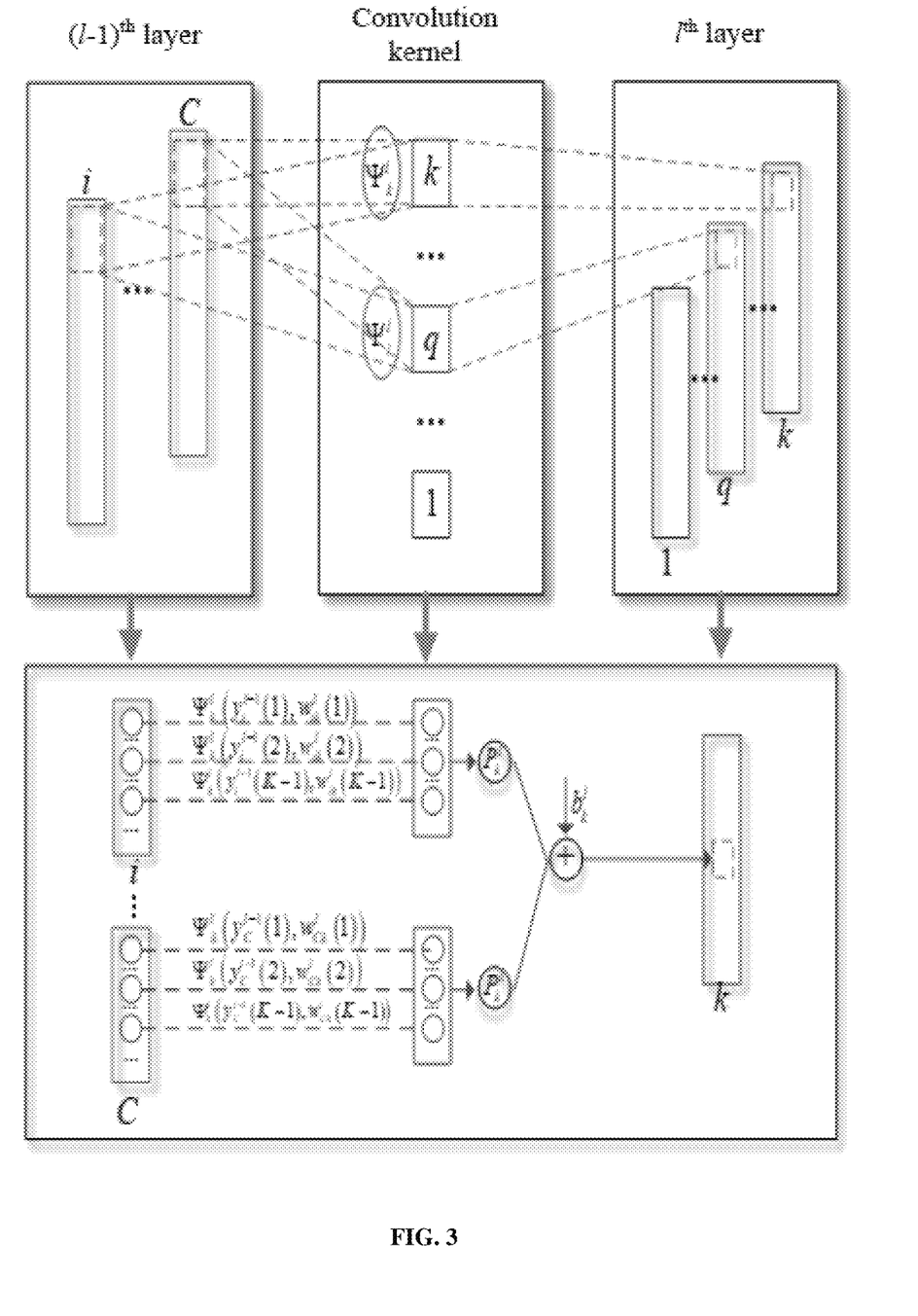
FIG. 3 is a schematic diagram of a framework of a self-organizing neural network provided by this embodiment.

Based on a framework of a simplified self-organizing neural network, in which node operators are nonlinear operations, parameters therein are selected by a particle swarm optimization algorithm.

Figure 2:
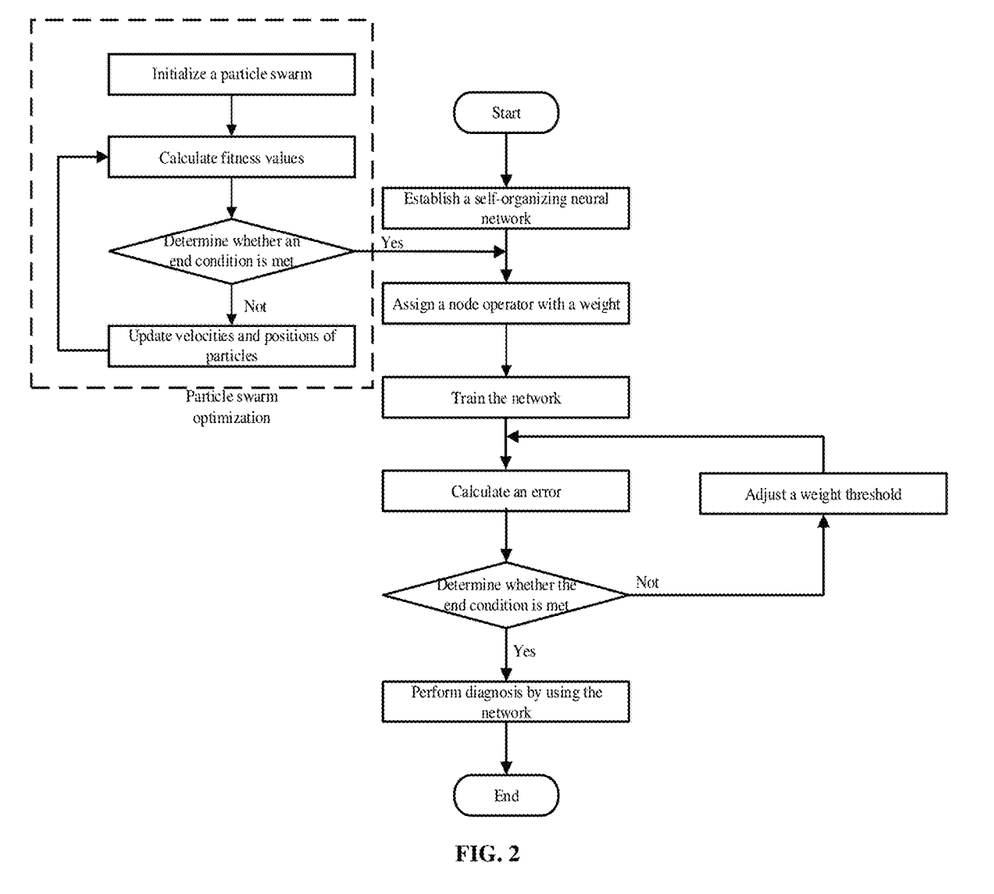
FIG. 2 is a schematic diagram of a process of selecting parameters of nonlinear operators by a particle swarm optimization algorithm provided by this embodiment.

More specifically, the particle swarm optimization algorithm is used to select weights of the nonlinear operators. As shown in FIG. 2, parameters of the particle swarm optimization algorithm are set, where a size of a particle swarm is set to 10, the maximum number of iterations is 50, a particle dimension is a product of the number n of network layers and the number m of the nonlinear operators, learning factors are set to c1=c2=2, and an inertia weight linear decreasing strategy is adopted for an inertia weight, with an expression as follows:

$$\omega = \omega_{max} - \frac{iter^*(\omega_{max}-\omega_{min})}{iter_{max}}$$

An error between a predicted result and an actual result is used as a fitness function in the particle swarm optimization algorithm, fitness values of particles are calculated, and an individual historical optimal position $A_i$ of each particle and a historical optimal position B in a whole particle swarm are determined.

Velocities v and positions x of the particles are updated, fitness values of the particles are recalculated, and new $A_i$ and B are determined, with an expression as follows:

$$v_{i\_d}^{k+1} = \omega v_{i\_d}^k + c_1 r_1 (a_{i\_d}^k - x_{i\_d}^k) + c_2 r_2 (B_d^k - x_{i\_d}^k)$$

It is determined whether new fitness meets a requirement, and if the new fitness meets the requirement, the next step is performed, otherwise, update is performed again until the maximum number of iterations is met or reached.

A data set is divided into a training set and a test set, the training set is used to train the self-organizing neural network, and the test set is used to test the performance of the trained network, such that a self-organizing neural network with the best performance is obtained for determining faults of a converter.

More specifically, a node operator $\Psi_k^l$ of an $l^{th}$ layer is selected, and the node operator is linear weighting of a sine operator $\sin(w_{ki}^l y_k^{l-1})$, an exponential operator $e^{(w_{ki}^l y_k^{l-1})}-1$, and a Gaussian operator $$w_{ki}^{l+1} e^{\left(-w_{ki}^l \left(y_k^{l-1}\right)^2\right)},$$

with an expression as follows:

$$\Psi_k^l = a_1^l \mathrm{Sin} + a_2^l \mathrm{Exp} + a_3^l \mathrm{Gauss}$$

where $a_1^l$, $a_2^l$, and $a_3^l$ are hyperparameters obtained by training with the particle swarm optimization algorithm.

A pooling operator $P_i^l$ is fixed as a summation operator, and an activation operator $f_i^l$ is a relu function.

An output vector of a channel i of an $(l-1)^{th}$ layer $y_i^{l-1}$ is and is convolved with a (K×1)-dimensional convolution kernel of the corresponding channel i, and this channel is calculated by the node operator and the pooling operator:

$$x_k^l(m) = b_k^l + \sum_{i=1}^{C} P_k^l\left(\Psi_k^l\left(w_{ik}^l(r)\left(y_i^{l-1}(m+r)\right)\right)\right)$$

$$= b_k^l + \sum_{i=1}^{C} \sum_{r=0}^{K-1} \Psi_k^l\left(w_{ik}^l(r)\left(y_i^{l-1}(m+r)\right)\right)$$

where $w_{ik}^l(r)$ is a weight at a position r of a $k^{th}$ convolution kernel corresponding to the channel i of the $(l-1)^{th}$ layer, and a size of each convolution kernel is 1×K; $x_k^l(m)$ is an input of an $m^{th}$ neuron of a $k^{th}$ channel of an $l^{th}$ layer; C is the number of channels of the $(l-1)^{th}$ layer; and $x_k^l(m)$ is a bias corresponding to the $k^{th}$ channel of the $l^{th}$ layer.

The final layer is set as a Softmax layer for determining a probability of outputting each type, with an expression as follows:

$$F_t = e^{o_t} / \sum_{r=1}^{g} e^{o_r}$$

where $F_t$ represents a possibility that an output feature of the neural network belongs to a type t, an output of the Softmax layer is a (g=12)-dimensional vector, a value of each element ($F_1$, $F_2$, . . . , $F_{12}$) is normalized to within a range of 0 to 1, and a sum of all elements is 1. A fault type of a sample can be determined by a maximum value in vectors.

Meanwhile, a cross entropy loss function is used to calculate the error, and the error is backpropagated, where an expression for the cross entropy loss function is as follows:

$$L_t = -\sum_{t=1}^{g} F_t^* \ln F_t$$

where $F_t^*$ and $F_t$ are a target value and an actual value of an output element, respectively.

A gradient descent method is used to update the parameters, where an expression for the gradient descent method is as follows:

$$w_{ik}^l(t+1) = w_{ik}^l(t) - \frac{dL}{dx_i^l} \nabla_w \Psi_{ki}^{l+1}$$

$$b_k^l(t+1) = b_k^l(t) - f'(x_k^l) \sum_{i=1}^{N_{l+1}} \frac{dL}{dx_i^l} \nabla_w \Psi_{ki}^{l+1}$$

until the training error meets an end condition.

This embodiment further provides a fault diagnosis apparatus for a four-switch Buck-Boost converter, including a computer memory, a computer processor, and a computer program stored in the computer memory and executable on the computer processor, where the self-organizing neural network proposed in the above embodiment is adopted in the computer memory.

The apparatus includes: a data preprocessing part configured to acquire fault parameters of a four-switch Buck-Boost converter, label data in different fault modes, and perform a preprocessing method such as normalization to obtain a data sample set;

a network structure optimization part configured to perform weight allocation before nonlinear operators of a self-organizing neural network are obtained by using a particle swarm optimization algorithm;

a network training part configured to set a data structure of the self-organizing neural network and update, during the training, parameters of a simplified self-organizing neural network by using a cross entropy loss function and a gradient descent method, where a training set is used for training, and a test set is used to select out a self-organizing neural network with the best performance; and a fault diagnosis part configured to diagnose both a structural fault and a parametric fault j of the four-switch Buck-Boost converter and directly input a new test sample by using the trained self-organizing neural network for fault diagnosis to obtain diagnosed fault types.

The computer processor, when executing the computer program, implements the following steps:

inputting circuit parameters of a four-switch Buck-Boost converter to the self-organizing neural network, so as to determine fault types of the four-switch Buck-Boost converter.

Those skilled in the art should understand that the embodiment of the present application may be provided as a method, a system, or a computer program product. Therefore, the present application may be in the form of a pure hardware embodiment, a pure software embodiment, or an embodiment combining software and hardware. Furthermore, the present application may be in the form of a computer program product executed by one or more computer-usable storage media containing computer-usable program codes therein (including but not limited to a magnetic disk memory, a compact disc read-only memory (CD-ROM), an optical memory, and the like). The solutions in the embodiments of the present application may be implemented in various computer languages, such as an object-oriented programming language Java and an interpreted scripting language JavaScript.

The present application is described with reference to the flowchart and/or the block diagram of the method, the device (system), and the computer program product according to the embodiments of the present application. It is to be understood that each process and/or block in the flowchart and/or the block diagram and combination of processes and/or blocks in the flowchart and/or the block diagram may be implemented by computer program instructions. These computer program instructions may be provided to a general-purpose computer, a special-purpose computer, an embedded processor, or a processor of another programmable data processing device so as to give rise to a machine with the result that the instructions executed by the computer or the processor of another programmable data processing device give rise to an apparatus configured to implement the functions designated by one or more processes in the flowchart and/or one or more blocks in the block diagram.

These computer program instructions may also be stored in a computer-readable memory that can direct the computer or another programmable data processing device to function in a particular manner, such that the instructions stored in the computer-readable memory produce a manufactured article including an instruction apparatus that implements the functions designated by one or more processes in the flowchart and/or one or more blocks in the block diagram. These computer program instructions may also be loaded on the computer or another programmable data processing device to perform a series of operation steps on the computer or another programmable device to generate the process implemented by the computer, such that the instructions executed by the computer or another programmable device provide steps used to implement the functions designated by one or more processes in the flowchart and/or one or more blocks in the block diagram.

While the preferred embodiments of the present application have been described, those skilled in the art may make additional changes and modifications to these embodiments once the basic creative concepts are known. Therefore, the attached claims are intended to be interpreted as including the preferred embodiments and all the changes and modifications falling within the scope of the present application. Apparently, those skilled in the art may make various changes and modifications to the present application without departing from the spirit and scope of the present application. In this way, if these changes and modifications of the present application fall within the scope of the claims of the present application and their equivalents, the present application is also intended to encompass these changes and modifications.

What is claimed is:

1. A fault diagnosis method for a four-switch Buck-Boost converter, comprising the following steps:
obtaining circuit parameters when different faults occur, labeling fault parameters with fault types, and combining the fault parameters and labels into a data set;
constructing a simplified self-organizing neural network consisting of a plurality of nonlinear operation modules, a weighting module, and an analysis module, performing, by the plurality of nonlinear operation modules, eigenvalue calculation based on the inputted circuit parameters, performing, by the weighting module, weighting calculation based on all eigenvalues to obtain weighted eigenvalues, and predicting, by the analysis module, the fault types based on the weighted eigenvalues; wherein a weight of each nonlinear operator in the plurality of nonlinear operation modules is calculated by using a particle swarm optimization algorithm, and a specific process is as follows:
setting parameters of the particle swarm optimization algorithm, wherein the number of particles is N, and a particle dimension D=the number n of network layers× the number m of nonlinear operators;
adopting an inertia weight linear decreasing strategy for an inertia weight, and using an error between a predicted result and an actual result as a fitness function in the particle swarm optimization algorithm to determine an individual historical optimal position of each particle and a historical optimal position in a whole particle swarm, wherein an expression for the inertia weight linear decreasing strategy is as follows:

$$\omega = \omega_{max} - \frac{iter*(\omega_{max}-\omega_{min})}{iter_{max}}$$

wherein $\omega$ is an inertia weight factor, and "iter" is the number of iterations; based on updated velocities and positions of the particles, recalculating fitness values of the particles and determining an individual historical optimal position of each particle and a historical optimal position in the whole particle swarm, wherein an expression for the updated velocities and positions of the particles is as follows:

$$v_{i\_d}^{k+1} = \omega v_{i\_d}^k + c_1 r_1(a_{i\_d}^k - x_{i\_d}^k) + c_2 r_2(B_d^k - x_{i\_d}^k)$$

wherein $1 \leq i \leq N$, $1 \leq d \leq D$; k represents the number of current iterations; $c_1$ and $c_2$ are learning factors; and $r_1$ and $r_2$ are random numbers in [0, 1];
determining whether new fitness meets a requirement, and if the new fitness meets the requirement, outputting an optimal position as an optimal weight value, otherwise, performing repeated iteration until an end condition is met;
the weighting calculation process of the weighting module is as follows:
a node operator $\Psi_k^l$ of an lth layer is selected, and the node operator is linear weighting of a sine operator $\sin(w_{ki}^l, y_k^{l-1})$, an exponential operator $e(w_{ki}^l, y_k^{l-1})-1$, and a Gaussian operator $w_{ki}^{l+1}e(-w_{ki}^l(y_k^{l-1})^2)$, with an expression as follows:

$$\Psi_k^l = a_1^l \sin + a_2^l \text{Exp} + a_3^l \text{Gauss}$$

wherein $a_1^l$, $a_1^l$, and $a_3^l$ are hyperparameters obtained by training with the particle swarm optimization algorithm,
a pooling operator $P_i^l$ is fixed as a summation operator, and an activation operator $f_i^l$ is a relu function;
an output vector of a channel i of an (l−1)th layer is $y_i^{l-1}$ and is convolved with a (K×1)-dimensional convolution kernel of the corresponding channel i, and this channel is calculated by the node operator and the pooling operator:

$$x_k^l(m) = b_k^l + \sum_{i=1}^{C} P_k^l\left(\Psi_k^l\left(w_{ik}^l(r)\left(y_i^{l-1}(m+r)\right)\right)\right)$$

$$= b_k^l + \sum_{i=1}^{C}\sum_{r=0}^{K-1} \Psi_k^l\left(w_{ik}^l(r)\left(y_i^{l-1}(m+r)\right)\right)$$

wherein $w_{ik}^l(r)$ is a weight at a position r of a $k^{th}$ convolution kernel corresponding to the channel i of the $(l-1)^{th}$ layer, and a size of each convolution kernel is 1×K; $x_k^l(m)$ is an input of an $m^{th}$ neuron of a $k^{th}$ channel of an $l^{th}$ layer; C is the number of channels of the $(l-1)^{th}$ layer; and $b_k^l$ is a bias corresponding to the $k^{th}$ channel of the $l^{th}$ layer; $\Psi_k^l$ is the node operator, $P_k^l$ is the pooling operator;

the analysis module is used for determining a probability of outputting each type, with an expression as follows:

$$F_t = e^{o_t} / \sum_{r=1}^{g} e^{o_r}$$

wherein $F_t$ represents a possibility that an output feature of the neural network belongs to a type t, an output of the Softmax layer is a (g=12)-dimensional vector, a value of each element $(F_1, F_2, \ldots, F_{12})$ is normalized to within a range of 0 to 1, and a sum of all elements is 1, a fault type of a sample can be determined by a maximum value in vectors; $O_t$ represents output information of a $t_{th}$ output neuron, $$\sum_{r=1}^{g} e^{o_r}$$

represents a sum of the exponents of the output information of neurons in a total of 12 types;

performing training by using the data set to obtain a self-organizing neural network for determining the faults of a converter; and inputting the circuit parameters of the four-switch Buck-Boost converter to the self-organizing neural network, so as to determine the fault types of the four-switch Buck-Boost converter;

wherein the faults comprise:

an open circuit fault of a switching tube S1, an open circuit fault of a switching tube S2, and an open circuit fault of a switching tube S3 of the four-switch Buck-Boost converter in a Buck mode;

an open circuit fault of a switching tube S1, an open circuit fault of a switching tube S3, and an open circuit fault of a switching tube S4 in a Boost mode;

an open circuit fault of a switching tube S1, an open circuit fault of a switching tube S2, an open circuit fault of a switching tube S3, and an open circuit fault of a switching tube S4 in a Buck-Boost mode;

an inductance drift exceeding 10%; and a capacitance drift exceeding 10%.

2. The fault diagnosis method for a four-switch Buck-Boost converter according to claim 1, wherein the circuit parameters comprise a bridge arm midpoint voltage, an inductive current, and an output voltage.

3. The fault diagnosis method for a four-switch Buck-Boost converter according to claim 1, wherein the circuit parameters need to undergo preprocessing, comprising normalization processing of the circuit parameters, before being inputted to the self-organizing neural network.

4. The fault diagnosis method for a four-switch Buck-Boost converter according to claim 1, wherein during the training, a cross entropy loss function and a gradient descent method are used to update parameters of the simplified self-organizing neural network.

5. A fault diagnosis apparatus for a four-switch Buck-Boost converter, comprising a computer memory, a computer processor, and a computer program stored in the computer memory and executable on the computer processor, wherein the self-organizing neural network according to claim 1 is adopted in the computer memory; and the computer processor, when executing the computer program, implements the following steps:

inputting circuit parameters of a four-switch Buck-Boost converter to the self-organizing neural network, so as to determine fault types of the four-switch Buck-Boost converter.

6. A fault diagnosis method for a four-switch Buck-Boost converter, comprising the following steps:

obtaining circuit parameters when different faults occur, labeling fault parameters with fault types, and combining the fault parameters and labels into a data set;

constructing a simplified self-organizing neural network consisting of a plurality of nonlinear operation modules, a weighting module, and an analysis module, performing, by the plurality of nonlinear operation modules, eigenvalue calculation based on the inputted circuit parameters, performing, by the weighting module, weighting calculation based on all eigenvalues to obtain weighted eigenvalues, and predicting, by the analysis module, the fault types based on the weighted eigenvalues; wherein a weight of each nonlinear operator in the plurality of nonlinear operation modules is calculated by using a particle swarm optimization algorithm, and a specific process is as follows:

setting parameters of the particle swarm optimization algorithm, wherein the number of particles is N, and a particle dimension D=the number n of network layers× the number m of nonlinear operators;

adopting an inertia weight linear decreasing strategy for an inertia weight, and using an error between a predicted result and an actual result as a fitness function in the particle swarm optimization algorithm to determine an individual historical optimal position of each particle and a historical optimal position in a whole particle swarm, wherein an expression for the inertia weight linear decreasing strategy is as follows:

$\omega = \omega_{max} - \text{iter} * (\omega_{max} - \omega_{min}) / \text{iter}_{max}$ wherein $\omega$ is an inertia weight factor, and "iter" is the number of iterations; based on updated velocities and positions of the particles, recalculating fitness values of the particles and determining an individual historical optimal position of each particle and a historical optimal position in the whole particle swarm, wherein an expression for the updated velocities and positions of the particles is as follows:

$v_{i\_d}^{k+1} = \omega v_{i\_d}^k + c_1 r_1 (a_{i\_d}^k - x_{i\_d}^k) + c_2 r_2 (B_d^k - x_{i\_d}^k)$ wherein $1 \leq i \leq N$, $1 \leq d \leq D$; k represents the number of current iterations; $c_1$ and $c_2$ are learning factors; and $r_1$ and $r_2$ are random numbers in [0, 1];

determining whether new fitness meets a requirement, and if the new fitness meets the requirement, outputting an optimal position as an optimal weight value, otherwise, performing repeated iteration until an end condition is met;

the weighting calculation process of the weighting module is as follows:

a node operator $\Psi_k^l$ of an $l^{th}$ layer is selected, and the node operator is linear weighting of a sine operator $\sin(w_{ki}^l, y_k^{l-1})$, an exponential operator $e(w_{ki}^l y_k^{l-1})-1$, and a Gaussian operator $$w_{ki}^{l+1} e^{\left(-w_{ki}^l \left(y_k^{l-1}\right)^2\right)},$$

with an expression as follows:

$$\Psi_k^l = a_1^l \operatorname{Sin} + a_1^l \operatorname{Exp} +_2^l \operatorname{Gauss}$$

wherein, $a_1^l$, $a_2^l$, and $a_2^l$ are hyperparameters obtained by training with the particle swarm optimization algorithm, a pooling operator $P_i^l$ is fixed as a summation operator, and an activation operator $f_i^l$ is a relu function;

an output vector of a channel i of an $(l-1)^{th}$ layer is $y_i^{l-1}$ and is convolved with a (K×1)-dimensional convolution kernel of the corresponding channel i, and this channel is calculated by the node operator and the pooling operator:

$$x_k^l(m) = b_k^l + \sum_{i=1}^{c} P_k^l\left(\Psi_k^l\left(w_{ik}^l(r)\left(y_i^{l-1}(m+r)\right)\right)\right)$$

$$= b_k^l + \sum_{i=1}^{C} \sum_{r=0}^{K-1} \Psi_k^l\left(w_{ik}^l(r)\left(y_i^{l-1}(m+r)\right)\right)$$

wherein $w_{ik}^l(r)$ is a weight at a position r of a $k^{th}$ convolution kernel corresponding to the channel i of the $(l-1)^{th}$ layer, and a size of each convolution kernel is 1×K; $x_k^l(m)$ is an input of an $m^{th}$ neuron of a $k^{th}$ channel of an $l^{th}$ layer; C is the number of channels of the $(l-1)^{th}$ layer; and $b_k^l$ is a bias corresponding to the $k^{th}$ channel of the $l^{th}$ layer; $\Psi_k^l$ is the node operator, $P_k^l$ is the pooling operator;

the analysis module is used for determining a probability of outputting each type, with an expression as follows:

$$F_t = e^{o_t} / \sum_{r=1}^{g} e^{o_r}$$

wherein $F_t$ represents a possibility that an output feature of the neural network belongs to a type t, an output of the Softmax layer is a (g=12)-dimensional vector, a value of each element ($F_1, F_2, \ldots, F_{12}$) is normalized to within a range of 0 to 1, and a sum of all elements is 1, a fault type of a sample can be determined by a maximum value in vectors; $O_t$ represents output information of a $t^{th}$ output neuron, $$\sum_{r=1}^{g} e^{o_r}$$

represents a sum of the exponents of the output information of neurons in a total of 12 types;

performing training by using the data set to obtain a self-organizing neural network for determining the faults of a converter; and inputting the circuit parameters of the four-switch Buck-Boost converter to the self-organizing neural network, so as to determine the fault types of the four-switch Buck-Boost converter;

wherein the faults comprise:

an open circuit fault of a switching tube S1, an open circuit fault of a switching tube S2, and an open circuit fault of a switching tube S3 of the four-switch Buck-Boost converter in a Buck mode;

an open circuit fault of a switching tube S1, an open circuit fault of a switching tube S3, and an open circuit fault of a switching tube S4 in a Boost mode;

an open circuit fault of a switching tube S1, an open circuit fault of a switching tube S2, an open circuit fault of a switching tube S3, and an open circuit fault of a switching tube S4 in a Buck-Boost mode;

an inductance drift exceeding 10%; and a capacitance drift exceeding 10%;

wherein the circuit parameters comprise a bridge arm midpoint voltage, an inductive current, and an output voltage;

wherein the circuit parameters need to undergo preprocessing, comprising normalization processing of the circuit parameters, before being inputted to the self-organizing neural network; and wherein during the training, a cross entropy loss function and a gradient descent method are used to update parameters of the simplified self-organizing neural network.

* * * * *